United States Patent [19]

Fournier

[11] 4,155,825
[45] May 22, 1979

[54] INTEGRATED SPUTTERING APPARATUS AND METHOD

[76] Inventor: Paul R. Fournier, 1027 San Andres #2, Santa Barbara, Calif. 93101

[21] Appl. No.: 792,513

[22] Filed: May 2, 1977

[51] Int. Cl.² .............................................. C23C 15/00
[52] U.S. Cl. .................................. 204/192 R; 204/298
[58] Field of Search ................. 204/192 R, 192 C, 298

[56] References Cited

U.S. PATENT DOCUMENTS

| | | | |
|---|---|---|---|
| 3,530,057 | 9/1970 | Muly, Jr. | 204/298 |
| 3,711,398 | 1/1973 | Clarke | 204/298 |
| 3,878,085 | 4/1975 | Corbani | 204/298 |
| 4,021,277 | 5/1977 | Shirn et al. | 156/657 |

OTHER PUBLICATIONS

T. C. Tisone et al., "Low Voltage Triode Sputtering with a Confined Plasma, Part II: Plasma Characteristics & Energy Transport", J. Vac. Sci. Tech., vol. 12, pp. 1058-1066 (1975).

*Primary Examiner*—Aaron Weisstuch
*Attorney, Agent, or Firm*—Daniel J. Meaney, Jr.

[57] ABSTRACT

An integrated sputtering means for use in a triode sputtering apparatus having an ion target of a selected material positioned interior to a thin passageway in a housing and magnetic means which establishes a controlled magnetic field of flux having shaped magnetic lines of force which define a magnetic flux pattern having at least one selected flux density in at least one field direction contiguous the first surface of the ion target to encapsulate both electrons and plasma increasing efficiency of sputtering of selected material from the ion target and including an electron emitter and an electron collector to produce, in an evacuated enclosure, a controlled flow of electrons which collide with an ionizable gas within an evacuated enclosure forming a gas plasma which is attracted toward and impinges into an ion target surface formed of a selected material, the collision of which ejects from the ion target surface atoms of selected ion target material which adhere to a surface of the substrate forming a thin film of atoms of deposited ion target material on the substrate is shown.

A method and apparatus for depositing a thin film of material on a substrate by triode sputtering from an ion target of selected material using an integrated sputtering apparatus is shown.

23 Claims, 27 Drawing Figures

INTEGRATED SPUTTERING APPARATUS AND METHOD

BACKGROUND OF THE INVENTION

1. Field of the Invention

This invention relates to a novel and improved integrated sputtering apparatus for use in triode sputtering and, more in particular, to an integrated sputtering means having an ion target of a selected material positioned interior to a thin passageway in a housing and magnetic means which establishes a controlled magnetic field of flux to encapsulate both electrons and plasma, thereby increasing efficiency of sputtering of selected material from the ion target surface. Triode sputtering apparatus includes an electron emitter and an electron collector to produce, in an evacuated enclosure, a controlled flow of electrons which collide with an ionizable gas within the evacuated enclosure thereby, forming a gas plasma. Ions of gas plasma are attracted toward and impinge into an ion target surface formed of a selected material. The collision between the plasma ions and ion target surface eject or sputter atoms of the selected ion target material therefrom producing a vapor of ion target material within a certain portion of the evacuated enclosure. A substrate is positioned in the evacuated enclosure and within the ion target material vapor. Atoms of the ion target material adhere to a surface of the substrate, forming a thin film of atoms of deposited ion target material thereon.

2. Disclosure of the Prior Art

The technique of physical sputtering and use of the sputtering process for deposition of thin films on a substrate surface are well known in the prior art. In depth, disclosure and description of these phenomena are described in The Handbook of Thin Film Technology, published by McGraw-Hill, 1970, at pages 3-1 to 3-38 in a section entitled "Chapter 3, The Nature of Physical Sputtering" by Gottfried K. Wehner and Gerald S. Anderson and at pages 4-1 to 4-44 in a section entitled "Chapter 4, Application of Sputtering to the Deposition of Films" by Leon Maissel.

A number of issued United States Patents and publications disclose various methods and apparatus for sputtering, and the following are deemed relevant as known prior art to this invention.

U.S. Pat. No. 3,393,142 issued to R. M. Moseson on July 16, 1968, discloses a cathode sputter apparatus with plasma confining means which utilizes a triode sputtering apparatus having means for establishing an ion plasma adjacent an ion target. The electron releasing cathode includes apertures and nozzles to impart a desired configuration to the electrons. The electrons collide with an ionizable gas forming the ion plasma. In the absence of a magnetic field, the ion plasma tends to diverge in a flat wedge-shaped configuration near the anode. An electromagnetic coil, located to the exterior of the evacuated enclosure containing the triode sputtering apparatus, is positioned to establish parallel field lines at the end of the ion plasma which, in the absence of a magnetic field, would tend to diverge as described. The magnetic field has longitudinal and unidirectional field lines extending primarily through an open space located between the substrate and opposed parallel ion target. The substrate and target are positioned substantially parallel to the axis of the ion plasma sheet located therebetween.

U.S. Pat. No. 3,487,000 issued to Hajzak on Dec. 30, 1969, discloses an evacuable, rectangular, box-like ion plasma confining enclosure located within an evacuable chamber for confining the ion plasma. Electrons from an electron source are emitted into the box-like chamber. An ionizable gas is admitted into the enclosure for forming the ion plasma and a target is supported within the box-like chamber on a target support assembly. A substrate is mounted over a rectangular aperture formed in one wall of the enclosure and receives the sputtered material. The box-like enclosure is electrically isolated and has an electrical charge formed thereon from the ion plasma which reduces electron drain from the plasma.

U.S. Pat. No. 3,516,919 issued to F. Gaydou et al on June 23, 1970, teaches the use of an external magnetic field in combination with cathode sputtering apparatus. The ion target is located in a second chamber or anode cavity. The vacuum is maintained between $10^{-4}$ to $10^{-3}$ torr. The ionizable gas is introduced in the vicinity of the thermionic cathode. The external magnetic field is an electromagnet which produces a magnetic field of a few hundred gauss with the magnetic lines of force parallel to the axis of the plasma stream. The plasma stream is relatively circular in cross-section. The magnetic field acts to confine the path of the plasma so sputtering can be accomplished at higher rates. The substrates are mounted on an arcuate shaped support assembly facing toward the ion target assembly, which assembly in turn is surrounded by an anode.

An article appearing in the February 1971 issue of Research/Development at pages 40 to 44, inclusive, entitled "Crossed Field Discharge Device For High Rate Sputtering" by James R. Mullaly, discloses a magnetron sputtering apparatus and describes the known prior art. In the magnetron sputtering apparatus, the arcuate shaped cathode functions as an electron emitter and target. A ring anode is located around one edge of the cathode. During the sputtering process, selected portions of the cathode are intensely deteriorated or eroded as material is sputtered therefrom, producing a ring source of sputtered material. A magnetic field, described either as a quadrupole field or single-cusp magnetic mirror, is produced by electromagnetic coils located external to the apparatus. The magnetic lines of force form a "V-shaped" pattern commencing at one edge of a substrate and extending into two directions, one toward the cathode and one toward and passing through the substrate. The magnetic flux density is in the order of 200 gauss or less. The magnetic field, produced by the external electromagnets, and electric field between the anode and cathode are static, forcing the electrons into long cycloidal paths. An ionizable gas is discharged into the evacuated chamber. The apparatus operates typically in a vacuum of $5 \times 10^{-3}$ torr.

U.S. Pat. No. 3,654,123 issued to Hajzak on Apr. 4, 1972, teaches the use of a triode sputtering apparatus in combination with an external electromagnetic flux means having magnetic coils, a flux strap, curved flux distributing plates mechanically connected to the flux strap and signal generating means. The curved flux distributing plates generate an essentially uniform flux or B-field within the evacuated enclosure. The uniform flux tends to condense or confine the plasma to the spacial region of the target. The target is supported and positioned, without confinement, between the cathode and anode. The flux strap confines the flux outside the evacuated enclosure within the strap. Electrons emitted from the cathode are shaped by an electron deflector into an elongated rectangle to achieved sheet-like emitted electron flow and plasma. In the absence of the B-field, a cone-like plasma would be formed. The signal generating means periodically cycles the B-field and varies its strength and orientation.

U.S. Pat. No. 3,669,860 issued to Knowles et al on June 13, 1972, discloses a diode sputtering apparatus wherein the cathode functions as the electron emitter and target. A magnetic field produced by a plurality of externally located electromagnets extends transversely through the space between the cathode and substrate to deflect electrons emitted from the cathode transversely clear of the substrate. The magnetic field is electrically rotated about a path or axis extending between the cathode and substrate being coated.

U.S. Pat. No. 3,878,085 issued to Corbani on Apr. 15, 1975, discloses a magnetron or cathode sputtering apparatus wherein the face of the cathode to be sputtered is formed into closed annular shaped configuration. Magnetic means are located adjacent to the cathode at a side opposite the cathode face. The magnetic means include a pair of magnetic pole pieces, at least one of which is elongated, which form arcuate shaped magnetic lines of force. The magnetic lines of force form a tunnel-like path wherein all side walls are magnetic lines of force and the bottom is the cathode face. Since the cathode face is formed into a closed or annular shaped configuration, the tunnel-like path forms a ring of arcuate shaped magnetic lines of force which tend to trap charged particles within the ring and against the cathode face. The charged particles then whirl around the inside of the ring adjacent to the cathode face. Thus, the magnetic field is formed into a closed loop or "racetrack" configuration, the result of which is to increase sputtering activity.

U.S. Pat. No. 3,956,093 issued to McLeod on May 11, 1976, discloses a planar magnetron sputtering apparatus which includes a ring-shaped closed loop magnetic field around the plate of a cathode face being sputtered. A second variable magnetic field is produced from an AC signal controlled electromagnetic field device producing lines of force which are generally normal to the surface of the cathode plate to vary the erosion depth on the cathode plate throughout the erosion region.

In order to better appreciate the teachings of the present invention, the operating characteristics and differences of the cathode sputtering apparatus and the triode sputtering apparatus will now be considered.

Magnetron-type sputtering sources, of which Corbani U.S. Pat. No. 3,878,085 and McLeod U.S. Pat. No. 3,956,093 are typical, utilize the cathode both as a target and as a secondary source of electrons. Electrons generated at the target arise from secondary emission and photoemission. The quantity of generated electrons is determined by a number of factors, such as, for example, target material, target voltage, chamber pressure and plasma ion species. During the sputtering operation, a predetermined quantity of target-generated electrons results for a given fixed target current density (all other operational parameters constant) at known different targe voltage level for each different target material. For example, a typical magnetron source operating at a fixed target current density of about 50 milliamperes per square centimeter would require a target voltage level of about $-300$ volts for a niobium target and about $-700$ volts for a gold target. Differing plasma impedance levels exist for different target materials at a given operating target voltage. The operating voltage is a dependent parameter based on source design and operating conditions. Each are inherent qualities of a magnetron source.

Relying on a target to supply a limited quantity of electrons to the plasma discharge has a further restriction in that such sources cannot operate a high current densities below vacuum pressures of approximately $2 \times 10^{-3}$ torr. Below this pressure, there is an insufficient quantity of electrons generated and an insufficient quantity of ionized gas molecules present to sustain continuous plasma operation. In general, typical operational pressures are maintained between about 5 to about $10 \times 10^{-3}$ torr.

A magnetron source generally requires magnetic field strengths greater than about 100 gauss, but more typically magnetic fields in the range of 250 to 1000 gauss are used for efficient source operation. In addition, in a magnetron source, an interrelationship exists between the magnetic field strength and the cathode potential. Plasma entrapment will break down if too high a potential appears on the cathode for a fixed magnetic field strength. Similarly, for a fixed cathode voltage, if magnetic field strengths are weakened below a critical level, plasma collapse again will occur. A balance between minimum magnetic field strength and maximum cathode potential must be maintained in order to achieve stable magnetron source operation.

In the structure described by Corbani and McLeod, if the primary magnetic fields are too strong, the cathode potential, at fixed current densities, will drop, causing a loss in sputtering rate. High magnetic field strengths also produce severe local target erosion which limits the useful life of a given cathode. Generally, in order to initiate and support magnetron plasma discharge at a partial pressure of approximately $5 \times 10^{-3}$ torr, a cathode potential exceeding $-200$ volts must exist. The precise cathode potential will vary, however, depending on a number of factors such as target composition and gas species.

Triode sputtering apparatus operate with considerably higher gas ionization efficiencies. This is due primarily to the use of a thermionic emitter which provides a copious supply of electrons. A large quantity of electrons, in turn, support generation of gas plasma. An increase in efficiency of generating gas plasma extends the useful operating pressure range of triode sputtering apparatus to a range lower than that of a magnetron source. A magnetron source operates at about $5 \times 10^{-3}$ torr and a triode sputtering source operates at about $1 \times 10^{-3}$ torr. Lowering operating and chamber pressures have a number of advantages, such as, for example, cleaner vacuum environments due to faster vacuum system pumping and higher sputter deposition efficiencies due to reduced gas scattering of the sputtered material. In addition, triode sputtering apparatus utilizes voltages of 50 volts or less to support the plasma discharge. Target voltages can be varied independently of all operational parameters. Typically, target potentials range from as low as $-50$ volts to as high as $-2000$ volts.

In prior art, triode sputtering apparatus as typified by Moseson, Gaydou and Hajzak, the function of utilizing magnetic fields is to prevent divergence of a space-oriented plasma beam, thereby increasing current flow to the target and decreasing ion bombardment of substrates and fixturing. These sputtering apparatus consist of elaborate fixturing of component parts both inside and outside an evacuable enclosure.

SUMMARY OF THE INVENTION

The present invention overcomes certain of the disadvantages of the known prior art triode sputtering apparatus. One advantage of the present invention is that the integrated sputtering means is a self contained unit. The integrated sputtering apparatus includes a housing which defines cavities and a means for defining a predetermined path within which the plasma is maintained and controlled. The integrated sputtering apparatus includes means for mounting an ion target in a predetermined relationship along the predetermined path such that one surface of the target, formed of at least one selected material, is positioned contiguous the path. The first surface forms a lower boundary along the predetermined path. The intergrated sputtering apparatus includes an electron emitter positioned in one cavity and the electron collector positioned in another cavity. Magnetic means are positioned adjacent the second surface of the ion target for establishing along the predetermined path a controlled magnetic field of flux having shaped magnetic lines of force which establish a magnetic flux pattern having at least one selected flux density in at least one field direction contiguous the first surface of the ion target.

In the present invention, the magnetic means and its relationship relative to the ion target surface provides a great deal of flexibility and control of the triode sputtering process. In the prior art triode sputtering apparatus described above, the magnetic means function to urge the plasma into a sheet-like shape. The magnetic flux pattern performs the major function of retarding divergence of the plasma located between the ion target and substrate, each of which are spaced from the anode, during the sputtering process. Although the prior art triode sputtering apparatus teaches the use of a magnetic field to enhance the triode sputtering process, the efficiency of the process and the control of the resulting sputtered atoms of target material is limited.

The prior art does not teach, disclose or suggest a triode sputtering apparatus having a magnetic means positioned adjacent an ion target to control sputtering rates of the ion target material with controlled magnetic fields of flux. The present invention discloses and teaches a magnetically enhanced, integrated sputtering apparatus which is capable of functioning within the highly desirable triode sputtering apparatus operating conditions with the attendant advantages of considerably higher gas ionization efficiencies and an abundance of electrons to support a gas plasma. Concurrently, the integrated sputtering apparatus of the present invention utilizes magnetic means for establishing shaped magnetic lines of force to precisely control the plasma-ion target interface, resulting in higher sputtering rates of the ion target material, thereby greatly increasing sputtering efficiencies over that of the known prior art triode sputtering apparatus.

Therefore, one advantage of the present invention is that a magnetic means is positioned adjacent the second surface of the ion target for establishing along the predetermined path between the orifices and contiguous the first surface, in the passageway generally traversed by the plasma, a controlled magnetic field of flux. The controlled magnetic field has shaped magnetic lines of force which define a magnetic flux pattern having at least one selected flux density in at least one field direction contiguous the first surface of the ion target. The plasma is thus contained between the magnetic flux pattern and the shaped magnetic lines of force function, in essence, as an upper boundary of the predetermined path relative to the first surface of the ion target, which functions as a lower boundary to the predetermined path. The magnetic field of flux urges the plasma charged particles against the first surface of the ion target, thereby increasing overall rate and efficiency at which the ions are drawn toward and sputter atoms from the ion target surface. The controlled magnetic field of flux forms shaped magnetic lines of force having a selected magnetic flux pattern and predetermined flux density and field direction. This provides wide flexibility for controlling the erosion pattern and sputtering rates of material from the ion target during the sputtering process.

Another advantage of the present invention is that the ion target surface can be formed of two selected materials or alternatively be two ion targets, each of different selected materials, enabling selective sputtering by a triode sputtering apparatus using the integrated sputtering apparatus of the present invention.

Yet another advantage of the present invention is that the magnetic means is located under and spaced a selected distance from the second surface of the ion target, establishes shaped magnetic lines of force which function as an upper boundary for containing the plasma in a thin passageway located between the orifices communicating with the first cavity and a second cavity defined by the housing.

Yet another advantage of the present invention is that the shaped magnetic lines of force can be controlled and selected as desired. Magnetic fields having a variety of selected shaped magnetic lines of force may be used to control the sputtering rates and efficiency of the sputtering process.

Another advantage of the present invention is that shaped magnetic lines of force may be formed into longitudinal planar shapes, transverse planar shapes, longitudinal arcuate shapes, transverse arcuate shapes and bifurcated arcuate shapes. In addition, the density or strength of the magnetic field can easily and selectively be increased or decreased depending on the sputtering application, ion target material and desired sputtering rates.

Still another advantage of the integrated sputtering apparatus of the present invention is that the apparatus can be physically located internal to an evacuable enclosure for triode sputtering. Alternatively, the integrated sputtering apparatus can be physically located external an evacuable enclosure and removably mounted to the exterior wall of the enclosure such that certain elements of the integrated sputtering apparatus communicate with the evacuable enclosure through an opening in the exterior wall of the enclosure. In an application, the first surface of the ion target, the first cavity and second cavity, the electron emitter and electron collector and the thin passageway and orifices defined by the housing extending between the first cavity and second cavity must be located within the evacuable enclosure. This arrangement provides access to the magnetic means, enabling easy adjustment of the shaped magnetic lines of force, and provides relatively easy access to changing the ion target materially giving wide flexibility for controlling, enhancing or otherwise selectively concentrating the sputtering of the ion target material.

Another important advantage of the present invention is that the method taught herein can be used for controlling sputtering efficiencies from ion targets and for controlling rates at which ion target material can be sputtered from an ion target in any sputtering process.

And yet another advantage of the present invention is that the integrated sputtering apparatus disclosed herein provides means for controlling the efficiency of the sputtering process, control of the erosion pattern on the ion target and selectively concentrating sputtering the material from selected areas of a target surface under precise predictable operating conditions.

One other advantage of the present invention is that an integrated sputtering apparatus having magnetic fields of flux is combined in magnetic flux patterns similar to those of magnetron-type sources with a triode electron-supported plasma discharge, which apparatus can be characterized as a hybrid triode-magnetron sputtering source capable of operating at vacuum levels as low as $2 \times 10^{-4}$ torr and at controllable target voltages between $-50$ to $-2000$ volts.

BRIEF DESCRIPTION OF THE DRAWING

The foregoing and other advantages and features of the invention will become apparent from the following description of the preferred embodiment when considered together with the illustrations in the accompanying drawing which includes the following figures.

DESCRIPTION OF THE PREFERRED EMBODIMENT

Figure 1:
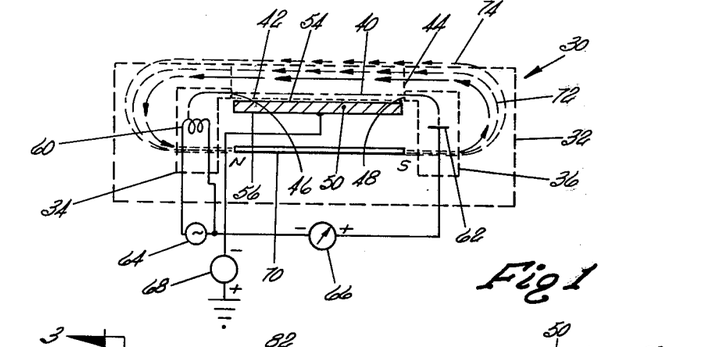
FIG. 1 is a diagrammatic representation of an integrated sputtering means of the present invention showing one embodiment of a magnetic means.

FIG. 1 illustrates the various components which comprise the integrated sputtering means generally designated as 30. The integrated sputtering means 30, which in the preferred embodiment is an integrated sputtering apparatus, includes means for defining a housing 32 having a first cavity 34 and a second cavity 36 spaced a predetermined distance from the first cavity 34. The housing 32 includes means for defining a predetermined path, shown by dashed line 40. Predetermined path 40 extends from the first cavity 34 to the second cavity 36 along an exterior surface 42 produced by an aperture 44 within the housing 32. The housing means 32 includes means for forming openings for the first cavity 34 and second cavity 36, such as a pair of elongated orifices, one orifice 46 for the first cavity 34 and the other orifice 48 for the second cavity 36. Each orifice 46 and 48 is positioned along the predetermined path 40.

The housing 32 includes means for mounting an ion target 50 along the predetermined path 40. Ion target 50 has a first surface 54 and a spaced opposed second surface 56. The second surface 56 is mounted interior to the housing 32 with the first surface 54 positioned along the predetermined path 40. The ion target 50 has its first surface 54 formed of at least one selected material. In the preferred embodiment, the ion target 50 is formed entirely from a selected material. However, it is within the teachings of this invention that the target material could be formed of a plurality of different areas of selected materials.

In FIG. 1, the first surface 54 of the ion target 50 is positioned between the orifices 46 and 48 such that the first surface 54 forms a lower boundary along the predetermined path 40.

An electron emitter 60, which in the preferred embodiment is a thermionic cathode, is located in the first cavity 34. An electron collector 62 is positioned in the second cavity. In the preferred embodiment, the electron collector is an anode. The electron emitter 60 and electron collector 62 may be located in either cavity 34 or 36. The first cavity 34, in the preferred embodiment, includes a 90° bend therein in order to isolate and prevent undesirable materials, which may be emitted by the electron emitter 60, from entering into and travelling along the predetermined path 40.

The electron emitter 60 is electrically connected to an energy source 64. Energy source 64 may be a filament supply having 6 volt, 40 amps, 60 HZ, A.C. operating characteristics. The electron collector 62 is electrically connected to the electron emitter 60 through a plasma power supply 66, which may be a 150 volt, 18 amps, D.C. power supply. In this embodiment, the anode is connected at a positive voltage potential relative to the thermionic cathode. The target 50 is electrically connected to a target supply 68 which may be a 600 volt, 3 amps, D.C. power supply. In the embodiment shown in FIG. 1, the target is biased negative relative to the electron collector 62. Thus, plasma supply 66 can be deemed as applying a positive voltage potential to electron collector 62 and a negative voltage potential to electron emitter 60. Similarly, the target 50 has a negative voltage potential applied thereto by the target supply 68.

A magnetic means 70 is positioned adjacent the second surface 56 of the ion target 50. The magnetic means 70 establishes along the predetermined path 40 a controlled magnetic field having shaped magnetic lines of force, generally designated by force lines 72. In a sputtering process, the shaped magnetic lines of force function as forming an upper boundary 74 along the predetermined path 40 and in the vicinity of aperture 44. The controlled magnetic flux pattern from magnetic means 70 establishes a selected magnetic flux density in a selected field direction contiguous the surface 54 of ion target 50. The shaped magnetic lines of force represented by arrow 72 is one embodiment of the magnetic flux pattern which can be formed by a magnetic means 70. Other shaped magnetic lines of force and magnetic flux patterns are described in detail in connection with the discussions of FIG. 4, 5, 6, 19, 20, 23, 25, 26 and 27.

Figure 2:
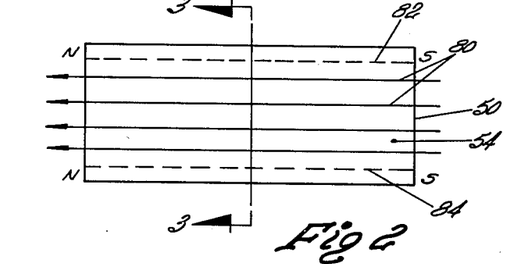
FIG. 2 is a top view of the first surface of an ion target illustrated in FIG. 1 and a magnetic means which forms longitudinal planar shaped magnetic lines of force defining a magnetic flux pattern having uniform flux density in one field direction generally planar and contiguous to the first surface of the ion target.

FIG. 2 shows the ion target 50 wherein the first surface 54 forms a lower boundary along the predetermined path 40 and longitudinal planar shaped magnetic lines of force are shown by magnetic lines 80, contiguous the first surface 54. A pair of spaced parallel elongated permanent magnets shown in FIG. 2 as dashed lines 82 and 84 are located under and spaced a selected distance from the second surface 56 of ion target 50.

Figure 3:
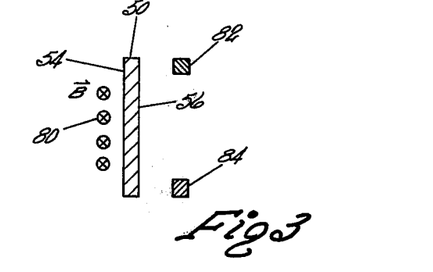
FIG. 3 is a sectional view taken along section lines 3—3 of FIG. 2 showing the magnetic means in this embodiment as permanent magnets spaced adjacent the second surface of the ion target and the longitudinal planar B-field.

FIG. 3 shows the relationship between target 50, first surface 54 and second surface 56 relative to the spaced adjacent elongated permanent magnets 82 and 84. In FIG. 3, the longitudinal planar shaped magnetic lines of force 80 are designated as a B-field having uniform density and one field direction into the sheet of drawing. In an embodiment of FIG. 1 utilizing the elongated permanent magnets 82 and 84 illustrated in FIGS. 2 and 3, a magnetic means for establishing a magnetic field having a strength in the order of 40 gauss or less may be used to practice this invention. When the shape of the magnetic lines of force are a longitudinal planar shape, as shown in FIGS. 1 and 2, the housing means includes side walls to contain the plasma within a thin passageway as further described in connection with FIGS. 8 to 13, inclusive.

Figure 4:
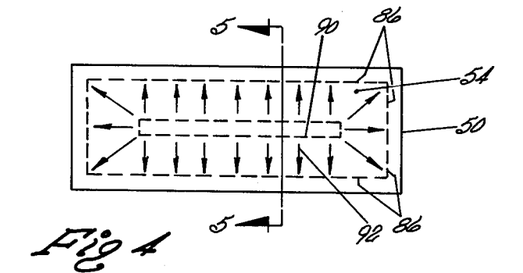
FIG. 4 is a top view of the first surface of an ion target illustrated in FIG. 1 and a magnetic means which forms bifurcated arcuate shaped magnetic lines of force defining a magnetic flux pattern which is formed into an endless path having a plurality of flux densities and two field directions generally normal and contiguous to the first surface of the ion target.
Figure 5:
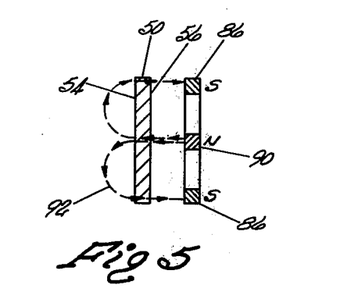
FIG. 5 is a sectional view taken along section lines 5—5 of FIG. 4 showing the magnetic means in this embodiment are two permanent magnets spaced adjacent the second surface of the ion target and the bifurcated arcuate shaped B-field.

FIG. 4 discloses an alternate construction for the magnetic means 70. In the embodiment of FIG. 4, the ion target 50 is illustrated with the first surface 54 in top view. The first surface 54 is formed of a selected material. The same embodiment of a magnetic means is shown in FIG. 5, and is located under and spaced a selected distance from the second surface 56. The magnetic means comprises a bifurcated magnet means which, in this embodiment, includes first rectangular permanent magnet positioned under and spaced from the periphery of the ion target 50. This is shown by dashed lines 86 on FIG. 4. The permanent magnet 86 is essentially rectangular in shape and establishes magnetic lines of force which traverse the periphery of the ion target 50. The magnetic lines of force extend circumferentially from permanent magnet 86 around the edge of the first surface 54.

A second elongated magnet, shown by dashed lines 90, is positioned under and spaced a selected distance from the second surface 56 at the center of the ion target 50. The elongated magnet 90 is located planar to and in the center of the rectangular permanent magnet 86. Each magnet 86 and 90 is spaced a predetermined distance from the second surface 56 of the ion target 50. The spacing between the rectangular shaped magnet 86 and the elongated magnet 90 relative to the second surface 56 is shown in FIG. 5. The rectangular shaped permanent magnet 86 and the elongated magnet 90 cooperate to establish a shaped magnetic line of force which is referred to as a bifurcated arcuate shaped pattern. The bifurcated arcuate shaped magnetic lines of force are formed around the periphery and center of the ion target 50. The controlled magnetic field of flux has a variety of flux densities at two field directions, contiguous the first surface 54. The magnetic lines of force, represented by arrow 92, extend circumferentially from the edge of the first surface 54 of the ion target 50 and converge on the center of the first surface 54.

FIG. 5 shows the shape of the magnetic flux pattern defined by the magnetic lines of force by arrows 92 to be two parallel arcuate shaped patterns in cross-section. The arcuate shaped patterns define an endless path on the first surface 54 of the ion target 50. The endless path is located between the orifices 46 and 48 shown in FIG. 1.

Figures 6, 7:
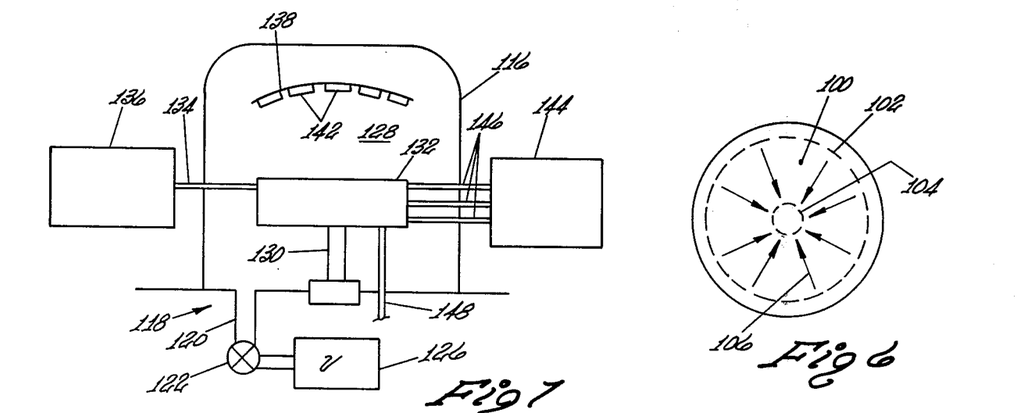
FIG. 6 is a top view of an annular shaped ion target wherein the magnetic means are a pair of coaxially aligned permanent magnets which form shaped magnetic lines of force which define a bifurcated arcuate radial magnetic flux pattern between the periphery and center of the ion target.
FIG. 7 is a diagrammatic view of an apparatus for depositing a thin film of material on a substrate by triode sputtering from an ion target wherein the integrated sputtering means is located interior to the evacuable chamber.

FIG. 6 shows a different ion target 100 which is circular in shape. The circular shaped ion target 100 has a first annular shaped permanent magnet, shown by dashed lines 102, located under and spaced a selected distance from the periphery of the undersurface of the ion target 100. A second circular shaped magnet, shown by dashed lines 104, is located under and spaced a selected distance from the undersurface of the ion target 100 and in planar alignment with the first annular shaped permanent magnet 102. Permanent magnets 102 and 104 cooperate to concurrently form shaped magnetic lines of force, as shown by arrows 106. The magnetic lines of force extend from the periphery to the center of the ion target 100 to produce an endless path wherein the bifurcated arcuate shaped flux pattern defining the path has varying flux densities and two field directions contiguous the top surface of the ion target 100. The magnetic lines of force extend circumferentially from the periphery of the ion target 100 and converge at the center thereof. The arcuate shaped magnetic lines of force represented by arrow 106 form an endless arcuate shaped magnet flux pattern.

FIG. 7 illustrates an apparatus for depositing a thin film of material on a substrate by triode sputtering from an ion target. The apparatus illustrated in FIG. 7 is one embodiment of an apparatus which is adapted to use the integrated sputtering means of the invention. In FIG. 7, the entire integrated sputtering apparatus is located within the evacuable enclosure. In particular, the apparatus includes an enclosure 116 which is capable of being evacuated. A means for evacuating the enclosure, generally designated as 118, may include a pumping port 120. The port 120 communicates with the enclosure 116 and a control valve 122. Valve 122 connects pumping port 120 to a source of vacuum shown by vacuum pump 126. The integrated sputtering means 132 is mounted within the interior 128 of chamber 116 by a mounting means 130. In the preferred embodiment, the integrated sputtering means may have the construction of the embodiment shown in FIGS. 8 to 10, inclusive.

The triode sputtering apparatus, shown In FIG. 7, further includes ionizable gas inlet means, generally designated as 134, which extend to a source of ionizable gas designated as 136. Inlet means 134 distributes ionized gas from a source 136 into the interior 128 of enclosure 116. In the preferred embodiment, the ionized gas is distributed directly in the vicinity of the ion target. The integrated sputtering apparatus is electrically connected to a power supply, generally designated by 144. The power supply 144 is electrically connected through the walls of enclosure 116 and the integrated sputtering apparatus 132 by a plurality of electrical conductors, generally designated as 146. Power supply 144 provides the various voltage potentials to the electron emitter 60 shown in FIG. 1, the electron collector, such as an anode 62 in FIG. 1, and the target shown as 50 in FIG. 1. Cooling fluid is passed through the integrated sputtering apparatus 132 and interior 128 by cooling means such as piping 148.

A substrate support means 138 is positioned above the integrated sputtering apparatus 132 and supports at least one substrate 142 within the interior 128 such that atoms of ion target material will be deposited on a surface of the substrate 142.

In the preferred embodiment, power supply 144 applies a negative voltage potential on electron emitter 60 and a positive voltage potential on electron collector 62. This results in a flow of electrons from the electron emitter 60 to the electron collector 62, as shown in FIG. 1. The electron flow within the enclosure 116 is sufficient to ionize the ionizable gas from source 136 within the thin passageway defined by housing 32 of FIG. 1.

Figures 8, 9:
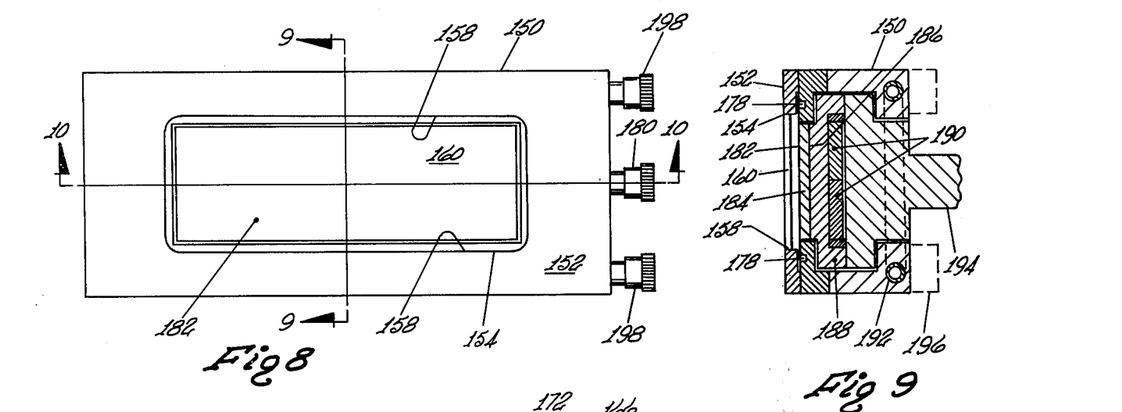
FIG. 8 is a top view of an embodiment of an integrated sputtering apparatus of the present invention adapted to be positioned within an evacuable chamber having a housing which defines in one exterior surface a thin passageway and side walls extending between a first cavity, a second cavity, and orifices all interior to the housing.
FIG. 9 is a sectional view taken along section lines 9—9 of FIG. 8 showing in section parallel elongated slots for discharging an ionizable gas on the first surface of an ion target.
Figure 10:
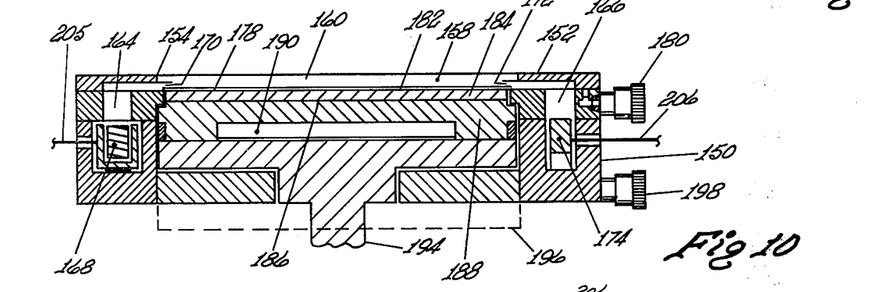
FIG. 10 is a sectional view taken along section lines 10—10 of FIG. 8 showing in section the relationship between the first cavity, second cavity, orifices, and side walls which define a thin passageway and position of the interior magnetic means.

FIGS. 8, 9 ad 10 show one embodiment of an integrated sputtering apparatus adapted for use within an evacuable enclosure for depositing a thin film of material on a substrate by triode sputtering. The integrated sputtering apparatus includes a housing 150. Housing 150 has an exterior surface 152 having an aperture, generally shown as 154, located on the exterior surface thereof. Side walls 158 are defined by the housing 150 forming a thin passageway within aperture 154. The side walls 158 extend inwardly toward the interior of housing 150 from the exterior surface 152 commencing at the edge of the aperture 154. The thin passageway is generally designated as 160. Referring specifically to FIG. 10, the thin passageway 160 communicates with a first cavity 164 which houses a thermionic cathode 168. The housing 150 also defines a second cavity 166, which houses an anode 174. The first cavity 164 communicates with the thin passageway 160 through orifice 170. Second cavity 166 communicates with the thin passageway 160 through orifice 172.

The side walls 158, defining the thin passageway 160, cooperate with the top surface 152 to form two parallel elongated gas distribution slots, generally shown as 178. The elongated gas distribution slots 178 cooperate with an inlet connector 180 to control the bleeding or distribution of ionized gas onto the surface 182 of an ion target 184. The ion target 184 has a second surface 186 which is spaced from and opposite to the first surface 182 and is supported by target support means 188. A pair of permanent magnet members 190 adapted for forming bifurcated arcuate shaped magnetic lines of force comprise the magnetic means in the integrated sputtering apparatus. A mounting means 194 extends between the housing 150 and to the base of the evacuable chamber (not shown). Electrical conductors 205 and 206 are electrically connected to the thermionic cathode 168 and the anode 174, respectively. A cooling fluid is passed through the housing 150 through inlets 198.

In the integrated sputtering apparatus shown in FIGS. 8 to 10, inclusive, the apparatus is physically located within the interior of evacuable enclosure. A source of ionizable gas supplies and coolant is applied to the integrated sputtering apparatus. In operation, a flow of electrons traverses from the thermionic cathode 168 located in the first cavity 164 through orifice 170, passageway 160 through orifice 172 into second cavity 166 to anode 174. Ionizable gas is bled through connector 180, into the elongated ports 178 and is distributed in the vicinity of the target within the thin passageway 160. The electrons collide with the ionizable gas, generating charged positive ions or plasma. The voltage potential applied to the target 184 extracts positively charged ions from the plasma and accelerates them towards the first surface 182 of ion target 184. The ions collide with atoms of the material forming the ion target first surface causing atoms of material to be sputtered from the ion target first surface 182 into the interior of the enclosure. A substrate, such as 142, supported by substrate holder 138 (illustrated in FIG. 7), is positioned with a substrate surface in the atmosphere of atoms of material, thereby permitting deposition of atoms of ion target material on the substrate surface. The magnetic means to control the magnetic field of flux may be alternately a pair of parallel elongated permanent magnets located under the second surface of the ion target as illustrated by dashed lines 196.

Figure 11:
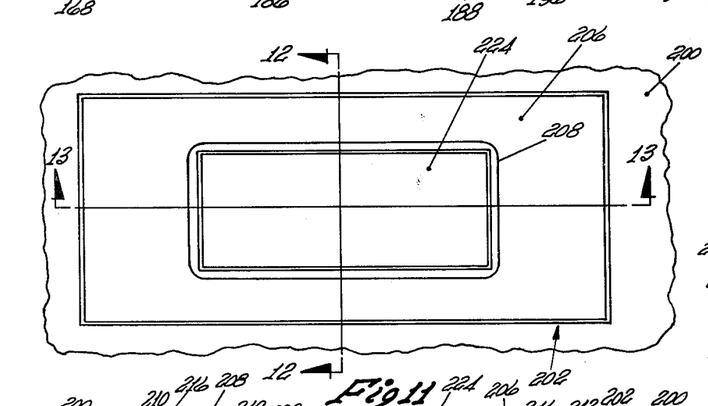
FIG. 11 is a top view of another embodiment of an integrated sputtering apparatus of the present invention adapted to be mounted on the exterior surface of an evacuable enclosure wherein the second surface of the ion target and a magnetic means are located exterior to the evacuable enclosure and the operating elements communicate through an opening in the enclosure exterior surface with the evacuable enclosure.
Figure 12:
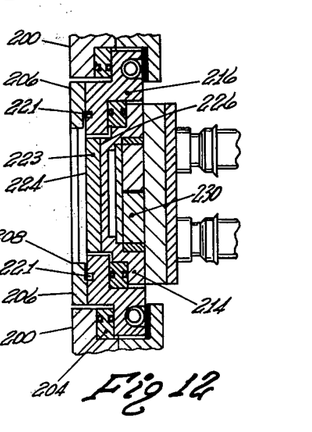
FIG. 12 is a sectional view taken along section lines 12—12 of FIG. 11 showing in section parallel elongated slots for discharging an ionizable gas on the first surface of the ion target.
Figure 13:
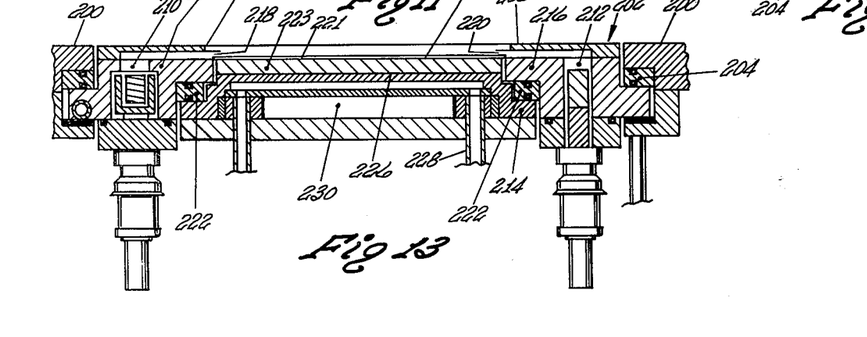
FIG. 13 is a sectional view taken along section lines 13—13 of FIG. 11 showing in section the relationship between the first cavity, second cavity, orifices, and side walls which define a thin passageway and position of the exterior magnetic means.

FIGS. 11, 12 and 13, inclusive, show another embodiment of an integrated sputtering means adapted to be mounted on an evacuable enclosure in a triode sputtering apparatus. The integrated sputtering apparatus is adapted to be mounted to the exterior wall 200 of an evacuable enclosure. The integrated sputtering apparatus has a housing, shown generally as 202, which is removably mounted in sealing contact with wall 200 through an electrically insulating seal 204. Housing 202 has an exterior surface 206 having an aperture 208 formed therein which communicates between the housing 202, through the chamber wall 200, into the evacuable chamber. The housing 202 includes means for defining a first cavity 210 and a second cavity 212, shown in FIG. 13. In particular, an internal member 216 of housing 202 defines the first cavity 210, the second cavity 212 and a surface for target mounting means 214 which includes passageways for cooling fluid. The exterior surface 206 and the interior member 216 cooperate to form a first orifice 218 and a second orifice 220. In addition, the exterior surface 206 and the interior member 216 cooperate to define a pair of parallel elongated ionizable gas distribution slots generally designated as 221 in FIG. 12. The means for mounting a target 214 is attached to internal housing member 216 through a target insulating seal 222. The target 223 has a first surface 224 and a second surface 226 and is supported by the mounting means 214. Cooling to the target mounting means 214 is provided through tubing 218. Magnetic means, generally designated as 230, are positioned adjacent to and spaced from the second surface 226 of the target 223. The magnetic means may be of any shape or arrangement, as described herein.

One advantage of the embodiment described and shown in FIGS. 11, 12 and 13 is to enable easy interchange of the target material or to enable use of a variety of magnetic means in order to control the sputtering, sputtering rates and erosion of the target material.

Figure 14:
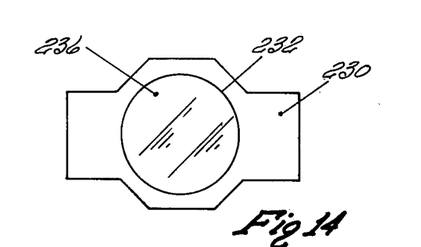
FIG. 14 is a top view of yet another embodiment of integrated sputtering apparatus having an annular shaped ion target.

FIG. 14 shows another embodiment of an integrated sputtering apparatus wherein a housing 230 has a circular aperture 232 and a circular ion target 236.

Figure 15:
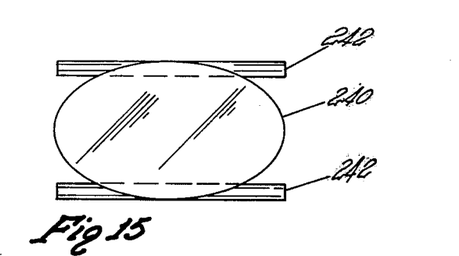
FIG. 15 is a diagrammatic representation of yet another embodiment of an integrated sputtering apparatus having an oval-shaped ion target and permanent magnets located under and spaced from the second surface of the oval ion target.

FIG. 15 shows an oval shaped ion target 240 having a pair of spaced parallel elongated permanent magnet members, shown generally as 242, located under the surface thereof. As illustrated in FIGS. 14 and 15, the ion target may be formed in a variety of shapes. The housing which encloses the ion target can, likewise, be formed of a plurality of shapes and sizes.

Figure 16:
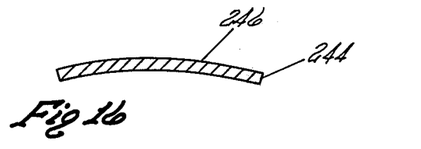
FIG. 16 is an end view in cross-section of an ion target showing a convex first surface.
Figure 17:
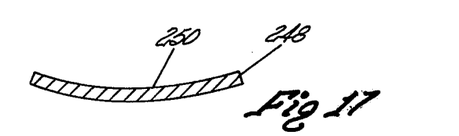
FIG. 17 is an end view in cross-section of an ion target having a concave first surface.

FIGS. 16 and 17 disclose other embodiments of ion targets. FIG. 16 discloses ion target 244 which has a convex first surface 246 while FIG. 17 shows an ion target 248 having a concave first surface 250.

Figure 18:
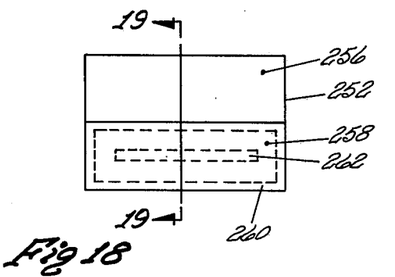
FIG. 18 is a top view showing an ion target formed of two sections having a first surface of selected material and a second adjacent surface of selected material and having a bifurcated magnetic means positioned under the ion target for selectively concentrating sputtering of the selection ion target materials.

FIG. 18 shows another embodiment of an ion target 252 which has a portion of the first surface comprised of a first selected material 256 and a portion of which is formed of a second selected material 258. In FIG. 18, a bifurcated magnetic means illustrated by dashed lines 260 and 262, is located under ion target 252 and positioned and spaced relative to the second selected material 258.

Figure 19:
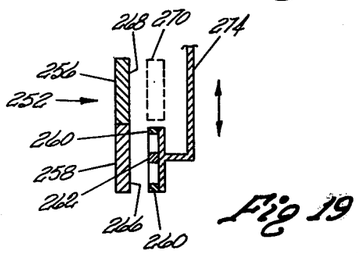
FIG. 19 is a sectional view taken along section lines 19—19 of FIG. 18 showing means attached to the bifurcated magnetic means for mechanically shifting the bifurcated magnetic means from under one section of the ion target surface to another section of the ion target surface.

In FIG. 19, the magnetic means is illustrated as positioned under and spaced from second surface 266 located under the second surface material 258. Alternately, the bifurcated magnetic means can be shifted and positioned under the second surface 268 located under the first selected material 256. The alternate position of the magnetic means is shown by dashed lines 270. Selective movement of the magnetic means from under second surface 266 to the alternate position 270 under the second surface 268 is accomplished by a linear movement of rod 274 connected to the bifurcated magnetic means.

Figure 20:
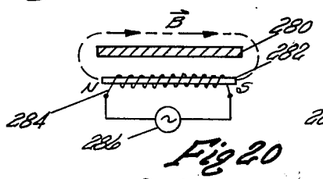
FIG. 20 is a diagrammatic representation of an ion target having electromagnetic means spaced under and located adjacent the second surface of an ion target which may be utilized in the diagrammatic representation of FIG. 1.
Figure 21:
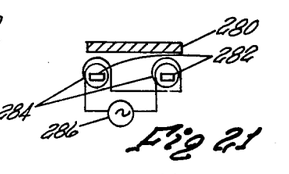
FIG. 21 is a diagrammatic representation, partially in a schematic diagram, of electromagnetic circuitry for controlling the shape of magnetic lines of force with magnetic means which includes an alternating current signal source.
Figure 22:
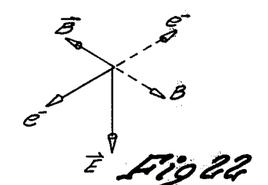
FIG. 22 is a graphic representation of the vector relationships between the B-field, E-field and electron flow as a function of the alternating current signal source of FIG. 21.

FIGS. 20 through 22 diagrammatically illustrate an ion target 280 having an electromagnetic means illustrated by pole pieces 282 energized by a coil 284 which is electrically connected to an alternating current source 286. In FIGS. 20 and 21, the AC source may be a signal having a frequency of approximately one megahertz. FIG. 22 is a graphic representation of the vector relationships of the E-field to the B-field which varies cyclically as a function of the alternating current through the coil 284. The result of the cyclic change in B-field is to deflect the electron, designated by e-, in an oscillating transverse path as electron traverses from the electron emitter to the electron collector.

Figure 23:
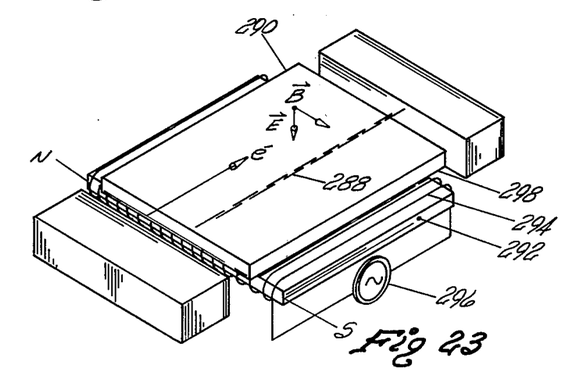
FIG. 23 is a perspective diagrammatic representation of an ion target and a magnetic means for establishing transverse planar shaped magnetic lines of force wherein the magnet means includes an alternating current source.

FIG. 23 illustrates diagrammatically an ion target 290 having a magnetic means located thereunder which generates transverse shaped magnetic lines of force. In this embodiment, the magnetic means includes a ferrite core 292 and windings 294 formed therearound. Windings 294 are electrically connected to an AC source 296 having a frequency of about one megahertz. The magnetic means is spaced a predetermined distance from the second surface 298 and is positioned relative thereto such that electrons flowing from the electron emitter to the electron collector traverse a longitudinal sawtooth pattern shown as sawtooth path 288.

Figure 24:
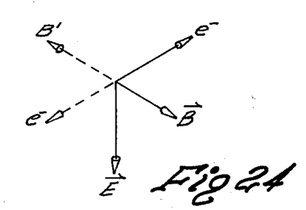
FIG. 24 is a graphic representation of the vector relationships between the B-field, E-field and the electron flow as a function of the alternating current signal source for FIG. 23.

FIG. 24 graphically shows the vector relationships between the E-field and B-field as the B-field is alternated in response to the alternating current source 296. The electron, e-, traverses a sawtooth longitudinal wave pattern as it travels from the electron emitter to the electron collector (not shown). The construction of the illustration in FIG. 23 generates transverse planar shaped magnetic lines of force.

Figure 25:
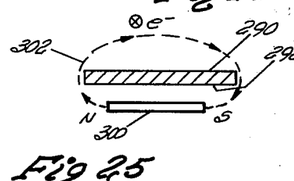
FIG. 25 is a diagrammatic representation of the physical relationship between an ion target and a permanent magnet for establishing transverse arcuate shaped magnetic lines of force.

FIG. 25 shows the same ion target 290 as in FIG. 23, the second surface 298 and alternate use of a permanent magnet 300 to form the transverse arcuate shaped magnetic lines of force. In FIG. 25, the resulting B-field is shown by arrows 302.

Figure 26:
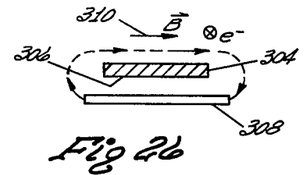
FIG. 26 is a diagrammatic representation of the physical relationship between an ion target and a permanent magnet for establishing transverse planar shaped magnetic lines of force.

FIG. 26 shows another embodiment of an ion target 304 having a second surface 306 and an elongated permanent magnet 308 spaced under the ion target 304 to form a transverse planar shaped magnetic lines of force shown by arrow 310.

In FIG. 25, the transverse B-field is relatively short and forms a transverse arcuate shaped flux density pattern. In FIG. 26, the transverse B-field is relatively elongated and produces a substantially planar transverse flux density pattern, all as determined by the length and shape of the magnets establishing the controlled magnetic field of flux.

Figure 27:
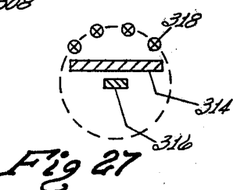
FIG. 27 is a diagrammatic representation of an ion target in end cross-section and single elongated permanent magnetic for establishing longitudinal arcuate shaped magnetic lines of force.

In FIG. 27, an ion target 314 has an elongated permanent magnet 316 located thereunder forming longitudinal arcuate shaped magnetic lines of force shown by symbols, generally shown as 318, illustrating direction and position of the magnetic lines of force.

In summary, the magnetic means, which is one element required in this invention, is defined as a magnetic means positioned adjacent a second surface of the ion target for establishing along a predetermined path and contiguous the first surface a controlled magnetic field of flux including lines of force which define a magnetic flux pattern having at least one selected flux density in at least one field direction contiguous the first surface of the ion target. In its broader aspect, when the strength or intensity of the magnetic field of flux is such that arcuate shaped magnetic lines of force will confine a plasma, the controlled magnetic lines of force and the first surface of the ion target may enclose the plasma without the requirement of any side walls to define a thin passageway. The shaped magnetic lines of force which may be used in this manner are: (1) longitudinal arcuate; (2) transverse arcuate; or (3) bifurcated arcuate. A longitudinal arcuate pattern is illustrated in FIG. 27, a transverse arcuate pattern is shown in FIG. 25 and a bifurcated arcuate pattern is illustrated in FIG. 5.

When the magnetic field is considered a weak field such that an arcuate pattern is unable to contain the plasma and in order to increase the sputtering efficiency and rates, side walls are required to define the thin passageway. Also, longitudinal planar and transverse planar shaped magnetic lines of force do require side walls to increase sputtering efficiency.

Use of side walls are illustrated in FIGS. 8 through 10 in an integrated sputtering apparatus which is enclosed entirely by an evacuable enclosure. Also, side walls are disclosed and used in an integrated sputtering apparatus illustrated in FIGS. 11 to 13 which is adapted for use with an evacuable enclosure wherein the housing cooperates with an aperture of the enclosure to enable the ion target surface, the first and second cavities and the thin passageway to communicate with the evacuated enclosure. The magnetic fields adapted for use with side walls meeting the above described criteria, can be generally characterized as: (1) longitudinal planar; (2) transverse planar; (3) weak longitudinal arcuate; (4) weak transverse arcuate; and (5) weak bifurcated arcuate.

The first two patterns; namely, the longitudinal planar pattern and the transverse planar pattern are illustrated in FIGS. 1 and 26, respectively. The latter three patterns are illustrated in the same figures which are described for the strong magnetic flux pattern except, however, that the magnetic fields of flux are sufficiently weak such that the side walls greatly enhance sputtering efficiency. In terms of magnitude, a strong magnetic field where so side walls are needed for the longitudinal arcuate, transverse arcuate and bifurcated arcuate patterns, would be in order of about 90 gauss or greater. A weak magnetic field would be in the order of about 10 to 20 gauss. The longitudinal planar and transverse planar shaped magnetic lines of force generally require sides, since in absence of side walls, the ions would be driven off of the edge of the ion target. Therefore, in such cases, side walls are needed, independent of weak or strong magnetic fields, for the longitudinal planar and transverse planar magnetic flux patterns in order to obtain efficient sputtering. However, it is within the teachings of this invention, that such fields could be used without side walls and that the sputtering process is still operable.

Lastly, each of the so called strong arcuate magnetic fields require an alternating current source in order to confine the electrons in a pattern to avoid the use of side walls. However, where reduced or weak magnetic fields are used in cooperation with side walls, various combinations of AC and DC sources may be used to develop the magnetic flux pattern, the selected flux densities and field directions contiguous the first surface of the ion target, as described herein.

The teachings of this invention relate to a novel and unique method for controlling sputtering rates in triode sputtering apparatus. The method controls the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas producing ions which sputter atoms of material from the ion target comprising the step of establishing with a magnetic means, as described herein, positioned adjacent a surface of the ion target other than the selected surface along the predetermined path and contiguous the selected surface, a controlled magnetic field of flux having shaped lines of force which define a magnetic flux pattern having at least one field direction contiguous the selected surface of the ion target.

The method has utility when the ion target selected surface is to have only a portion thereof controlled by the magnetic means. This is accomplished by the step of selectively concentrating the shaped magnetic lines of force to establish the magnetic flux pattern over a selected portion of the target surface. If the selected surface is formed of at least two selected materials, the percentage composition of sputtered atoms of each ion target material can be precisely controlled by the magnetic means establishing the controlled magnetic field of flux lines.

What is claimed is:

1. An integrated sputtering means comprising:
   means defining a housing having a first cavity, a second cavity spaced a predetermined distance from said first cavity and means for defining a predetermined path extending between said first cavity and said second cavity along an exterior surface of said housing defining means, said housing defining means including means for forming openings for said first cavity and said second cavity positioned along said predetermined path;
   means for mounting an ion target having a first surface adapted to be formed of at least one selected material and a spaced opposed second surface interior to the housing defining means with said first surface positioned contiguous said predetermined path and between the openings, thereby forming a lower boundary for said predetermined path;
   an electron emitter positioned in one of said first cavity and said second cavity;
   an electron collector positioned in the other of said first cavity and second cavity; and
   magnetic means positioned adjacent said second surface of the ion target for establishing along said predetermined path and contiguous said first surface a controlled magnetic field of flux having shaped lines of force which define a magnetic flux pattern having at least one selected flux density in at least one field direction contiguous the first surface of the ion target.

2. The integrated sputtering means of claim 1 where said housing defining means includes
   means for defining a passageway having a pair of spaced opposed side walls extending along said predetermined path between said first cavity and said second cavity.

3. The integrated sputtering means of claim 2 wherein said housing defining means includes means for mounting a thermionic cathode within said first cavity and substantially perpendicular to the orifice located between said first cavity and said passageway defining means.

4. The integrated sputtering means of claim 2 wherein said magnetic means includes means for establishing a controlled magnetic field of flux having longitudinal planar shaped magnetic lines of force which have a uniform flux density in one field direction contiguous said first surface.

5. The integrated sputtering means of claim 2 wherein said magnetic means includes means for establishing a controlled magnetic field of flux having transverse planar shaped magnetic lines of force which have a uniform flux density in one field direction contiguous said first surface.

6. The integrated sputtering means of claim 1 wherein the electron emitter is a thermionic cathode and said electron collector is an anode.

7. The integrated sputtering means of claim 1 where said magnetic means includes means for establishing a controlled magnetic field of flux having longitudinal arcuate shaped lines of force which have a varying flux density and one field direction contiguous said first surface.

8. The integrated sputtering means of claim 7 wherein said housing defining means includes means for defining a passageway having a pair of spaced opposed side walls extending along said predetermined path between said first cavity and said second cavity.

9. The integrated sputtering means of claim 1 where said magnetic means includes means for establishing a controlled magnetic field of flux having transverse arcuate shaped lines of force which have a varying flux density and one field direction contiguous said first surface.

10. The integrated sputtering means of claim 9 wherein said housing defining means includes
    means for defining a passageway having a pair of spaced opposed side walls extending along said predetermined path between said first cavity and said second cavity.

11. The integrated sputtering means of claim 1 where said magnetic means includes means for establishing a controlled magnetic field of flux having bifurcated arcuate shaped lines of force which have a varying flux density and have at least two field directions contiguous said first surface.

12. The integrated sputtering means of claim 11 wherein said housing defining means includes
    means for defining a passageway having a pair of spaced opposed side walls extending along said predetermined path between said first cavity and said second cavity.

13. The integrated sputtering apparatus of claim 1 wherein said mounting means includes
    means for mounting along said predetermined path adjacent said first ion target a second ion target having a first surface and a spaced opposed second surface, said second ion target having the first surface adapted to be formed of a second selected material.

14. Apparatus for depositing a thin film of material on a substrate by triode sputtering from an ion target material comprising;
    an enclosure
    means for evacuating said enclosure;
    an integrated sputtering means operatively coupled to said enclosure including
    means for defining a housing having a first cavity and a second cavity spaced a predetermined distance from said first cavity and means for defining a predetermined path extending between said first cavity and said second cavity along the exterior surface of said housing defining means, said housing defining means including means for forming openings for said first cavity and said second cavity positioned along said predetermined path;
    means for mounting an ion target having a first surface adapted to be formed of at least one selected material and a spaced opposed second surface interior to the housing defining means with said first surface positioned contiguous said predetermined path and between the openings forming a lower boundary for said predetermined path;
    an electron emitter positioned in one of said first cavity and said second cavity;
    an electron collector positioned in the other of said first cavity and said second cavity;
    magnetic means positioned adjacent said second surface of said ion target for establishing along said predetermined path and contiguous said first surface a controlled magnetic field of flux having shaped lines of force which define a magnetic flux pattern having at least one selected flux density in at least one field direction contiguous the first surface of the ion target;

means for providing an ionizable gas to said enclosure;

means for mounting a substrate within said enclosure and positioned relative to said integrated sputtering means and adapted to have sputtered ion target material deposited thereon;

means for applying a voltage potential to said electron emitter;

means for applying a voltage potential between said electron emitter and said electron collector to produce a flow of electrons from said electron emitter to said electron collector of sufficient energy to ionize an ionizable gas along said predetermined path contiguous said first surface of the ion target, thereby establishing plasma flow extending from the opening between said first cavity, said second cavity and said predetermined path; said plasma flow being defined on the lower boundary by said first surface of said ion target and on the upper boundary by said shaped magnetic lines of force; and means for applying a negative voltage potential on said ion target to extract and accelerate positively charged ions into said first surface of ion target material forming said lower boundary from said plasma flow to sputter atoms of material from said ion target first surface, forming an atmosphere of and depositing atoms of ion target material on the substrate.

15. Apparatus for depositing a thin film of material on a substrate by triode sputtering from an ion target material of claim 14 wherein said enclosure includes:

means defining an opening in an exterior surface of said enclosure; and means external and operatively coupled to said enclosure opening defining means and to said housing defining means for mounting the housing defining means with the opening positioning the ion target, a first surface within the enclosure and the spaced opposed second surface external to the enclosure, said housing defining means further being positioned with said predetermined path, the first cavity and the second cavity and the opening interior to the enclosure; and wherein said magnetic means is positioned adjacent said second surface of said ion target exterior to said enclosure for establishing in said enclosure contiguous said first surface the controlled magnetic field of flux.

16. A method for controlling the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas, thereby producing charged ions which sputter atoms of material from the ion target, comprising the step of establishing with a magnetic means positioned adjacent a surface of the ion target other than the selected surface (along said predetermined path and contiguous the selected surface), a controlled magnetic field of flux having shaped lines of force which define a magnetic flux pattern having at least one selected flux density in at least one field direction contiguous the selected surface of the ion target.

17. The method of claim 16 comprising the steps of mounting a first ion target formed of one selected material adjacent a second ion target formed of a second selected material.

18. The method of claim 17 comprising the steps of selectively concentrating said controlled magnetic field of flux under at least one of said first ion target and said second ion target.

19. An integrated sputtering means for use in combination with an evacuable enclosure, comprising:

means defining a housing having a pair of spaced cavities having a predetermined distance therebetween and means for defining a predetermined path extending between said cavities along an exterior surface of said housing defining means, said housing defining means including means for forming openings for each of said cavities positioned along said predetermined path;

means for mounting an ion target having a first surface adapted to be formed of at least one selected material and a spaced opposed second surface interior to the housing defining means with said first surface positioned contiguous said predetermined path and between the openings, thereby forming a lower boundary for said predetermined path;

means positioned in said cavities for producing a copious supply of electrons therebetween; and magnetic means positioned adjacent said second surface of the ion target for establishing along said predetermined path and contiguous said first surface a controlled magnetic field of flux having shaped lines of force which define a magnetic flux pattern having at least one selected flux density in at least one field direction contiguous the first surface of the ion target.

20. An integrated sputtering means comprising:

means defining a housing having a first cavity, a second cavity spaced a predetermined distance from said first cavity and means for defining a predetermined path extending between said first cavity and said second cavity along an exterior surface of said housing defining means, said housing defining means including means for forming openings for said first cavity and said second cavity positioned along said predetermined path;

means for mounting a first ion target having a first surface adapted to be formed of at least one selected material and a spaced, opposed second surface interior to the housing defining means with said first surface positioned contiguous said predetermined path and between the openings, thereby forming a lower boundary for said predetermined path and for mounting along said predetermined path adjacent said first ion target a second ion target having a first surface and a spaced, opposed second surface, said second ion target having the first surface adapted to be formed of a second selected material;

an electron emitter positioned in one of said first cavity and said second cavity;

an electron collector positioned in the other of said first cavity and second cavity;

magnetic means positioned adjacent said second surface of the ion target for establishing along said predetermined path and contiguous said first surface a controlled magnetic field of flux having shaped lines of force which define a magnetic flux pattern having at least one selected flux density in at least one field direction contiguous the first surface of the ion target; and means operatively coupled to said magnetic means for selectively concentrating said controlled magnetic field of flux under one of said first ion target and said second ion target.

21. The integrated sputtering apparatus of claim 20 where said selectively concentrating means includes means for mechanically selectively positioning said controlled magnetic field of flux under the second surface of one of said first ion target and said second ion target.

22. A method for controlling the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas producing charged ions which sputter atoms of material from the ion target comprising the steps of:

establishing with a magnetic means positioned adjacent a surface of the ion target other than the selected surface, a controlled magnetic field of flux having shaped lines of force which define a magnetic flux pattern having at least one selected flux density in at least one field direction contiguous the selected surface of the ion target;

mounting a first ion target formed of one selected material adjacent a second ion target formed of a second selected material; and mechanically selectively positioning said controlled magnetic field of flux under one of said first ion target and said second ion target to sputter a higher concentration of ion target material from one of the first surfaces of the first ion target and second ion target.

23. A method for controlling the rate at which an ion target material can be sputtered from a selected surface of an ion target in triode sputtering apparatus wherein a plasma is formed in the vicinity of the selected surface of the ion target by electrons being transported along a predetermined path contiguous the selected surface from a cathode to an anode, which electrons collide with and ionize an ionizable gas; thereby producing charged ions which sputter atoms of material from the ion target comprising the steps of:

establishing with a magnetic means positioned adjacent a surface of the ion target other than the selected surface, a controlled magnetic field of flux having shaped lines of force which define a magnetic flux pattern having at least one selected flux density in at least one field direction contiguous the selected surface of the ion target;

mounting a first ion target formed of one selected material adjacent a second ion target formed of a second selected material, and mechanically positioning a bifurcated controlled magnetic field of flux under one of said first ion target and said second ion target to sputter a higher concentration of ion target material from one of the first surfaces of the first ion target and second ion target.

* * * * *